United States Patent [19]

Senda et al.

[11] Patent Number: 4,756,928

[45] Date of Patent: Jul. 12, 1988

[54] METHOD OF FORMING ELECTRODES OF AN ELECTRONIC COMPONENT OF CHIP TYPE FOR CONNECTING TO THE EXTERNAL

[75] Inventors: Atsuo Senda, Otsu; Takuji Nakagawa, Kyoto, both of Japan

[73] Assignee: Murata Manufacturing Co., Ltd., Japan

[21] Appl. No.: 807,270

[22] Filed: Dec. 10, 1985

[30] Foreign Application Priority Data

Dec. 10, 1984 [JP] Japan ................... 59-261364

[51] Int. Cl.$^4$ ............................................. B05D 5/12
[52] U.S. Cl. ...................... 427/77; 427/58; 427/79; 427/96; 427/101; 204/192.1; 204/192.12
[58] Field of Search ............ 427/79, 101, 96, 58, 427/77; 204/192.1, 192.12

[56] References Cited

U.S. PATENT DOCUMENTS

| | | | |
|---|---|---|---|
| 4,011,143 | 3/1977 | Del Monte | 204/15 |
| 4,149,904 | 4/1979 | Jones | 357/91 |
| 4,278,706 | 7/1981 | Barry | 29/620 |
| 4,278,707 | 7/1981 | Biran | 427/96 |
| 4,444,635 | 4/1984 | Kobayashi | 204/192.12 |
| 4,469,719 | 9/1984 | Martin | 118/720 |
| 4,554,732 | 11/1985 | Sadlo | 29/620 |

OTHER PUBLICATIONS

G. T. Hefele, "Resist Applicator for Edge of Printed Circuit Boards", Western Electric Technical Digest, No. 54, Apr. 1979, pp. 7-8.

*Primary Examiner*—Shrive P. Beck
*Assistant Examiner*—Vi Duong Dang
*Attorney, Agent, or Firm*—Ostrolenk, Faber, Gerb & Soffen

[57] ABSTRACT

Thin film electrodes are formed on a chip-type electronic component for connecting to external circuitry.

The electronic components is first located so that a first principal plane thereof faces toward a scattering source of an electrode-forming. The first principal plane is covered with a mask except for a pair of edge portions of the first principal plane, which extend a little toward the center of the first principal plane from a pair of first edges. The first edges are respectively defined by the first principal plane and two opposing end planes of the component.

A thin film of the electrode material is deposited on each of the edge portions of the first principal plane, on the first edges, and on first portions of the end planes, which extend onto the end planes from the first edges. Then the electronic component is located so that a second principal plane counter to the first principal plane faces toward the scattering source. The second principal plane is covered with the mask except for a pair of edge portions of the second principal plane which extend a little toward the center of the second principal plane, from a pair of second edges. The second edges are respectively defined by the second principal plane and the above-mentioned two end planes of the component.

Then a thin film of the electrode material is deposited on each of the edge portions of the second principal plane, on the second edges, and on second portions of the end planes, which extend onto the end planes from the second edges, so as to overlap partially with the thin film having been deposited on the first portions of the end planes.

19 Claims, 3 Drawing Sheets

METHOD OF FORMING ELECTRODES OF AN ELECTRONIC COMPONENT OF CHIP TYPE FOR CONNECTING TO THE EXTERNAL

FIELD OF THE INVENTION

The present invention relates to a method of forming electrodes of an electronic component of chip type for connecting to the external.

PRIOR ART

A capacitor, a resistor and an inductor are representative of electronic components of chip type.

FIG. 1 is an elevational view showing a typical structure of a monolithic ceramic capacitor of chip type. A multi layered structure 1 is composed of a plurality of dielectric ceramic layers 2 being interposed with an internal electrode 3 between each two adjacent layers 2. Electrodes 4 for connecting to the external (hereinafter referred to as external electrodes) are formed on opposite sides of the multi layer structure 1 respectively.

FIG. 2 is an elevational view showing a typical structure of a resistor of chip type. Two electrodes 6 are formed on a substrate 5 made of alumina, and a resistive part 7 is formed between the electrodes 6 for example by baking resistor paste made from $RuO_2$. Further, external electrodes 8 are so formed on each of opposite sides of the substrate as to contact with the electrodes 6, respectively.

FIG. 3 is a schematic elevational view showing a typical structure of an inductor of chip type.

The inductor of this type is made as follows:

A plurality of green sheets of ferrite each having a pattern of conductor on the surface thereof are so stacked as to define a coil therein by connecting each pattern electrically through a so-called throughhole (not shown in FIG. 3) formed on each green sheet. Then, the stacked green sheets are pressed and baked to form a chip body. On each of two opposite sides of the chip body an external electrode is so formed as to contact each end of the coil formed therein.

The external electrodes 4, 8, 11 of the above-mentioned electronic components of chip type are usually formed by painting or printing silver paste which includes glass frit and vehicle and by baking the paste in air.

The external electrodes are thick inevitably because they are formed by the baking of paste as explained above. Particularly, boss portions A are formed at edge portions of the principal planes of electronic component, as shown in FIGS. 1-3. For example, in such a capacitor as shown in FIG. 1, the thickness of the chip body itself is 500 $\mu$m, while that of a boss portion A of an external electrode is about 50 $\mu$m. In other words, the total thickness of the two boss portions A of about 100 $\mu$m amounts to twenty percent of the thickness of the chip body itself.

Such a structure of external electrodes causes following problems:

First, when these electronic components of chip type are picked up by a vacuum chuck means on mounting them onto a print circuit board, it becomes very difficult to pick up these components by the vacuum chuck means because the upper plane of each component is not even, and leaves a gap due to the boss portions between the vacuum chuck and the component.

Next, due to the boss portions A, it becomes difficult to make the thickness of an electronic component of chip type thinner. This leads to such a disadvantage that electronic components of chip type cannot be mounted in an electric equipment where the height or space for mounting is limited to a very narrow range. As to a capacitor of chip type, the number of dielectric layers to be stacked can be decreased in order to cancel the increase in thickness due to the boss portions of the external electrodes. However, such a capacitor has only a smaller capacitance.

In order to solve the problems, it has been proposed to form an external electrode with a technique for forming a thin film such as the vacuum deposition process, the sputtering process and the ion plating process.

In the Japanese Patent laid open publication No. 64017/1983, there is proposed a method of forming electrodes utilizing the sputtering process. FIG. 4 is a side sectional view of a monolithic ceramic capacitor of chip type wherein external electrodes are formed with use of the sputtering process. According to the method proposed, a multi layer unit 14 composed of dielectric material with internal electrodes 17, 18 formed therein is put in a pocket 13 of a masking apparatus 12. Then, the multi layer unit 14 in the masking apparatus 12 is placed in a sputtering apparatus. Next, a target 15 is sputtered, and sputtered particles adhere to a side of the multi layer unit 14 to form an external electrode 16.

However, the external electrode 16 prepared by such a process has not sufficient adhesive strength to the multi layer unit 14 because the external electrode 16 is formed only on a plane surface of the multi layer unit 14. In order to solve this problem, it was also proposed in said publication that the surface should be made rough with use of the sputter etching process. However, this process does not result in sufficient adhesive strength.

Therefore, it is necessary to improve the adhesive strength of external electrodes from a structural point of view. In other words, it is necessary to form external electrodes not only on a side but also extending to the top and bottom planes like a square bracket symbol, as shown in FIGS. 1-3.

However, it is impossible to form an external electrode extending to the top and bottom planes of an electronic component of chip type by utilizing the masking apparatus 12 as shown in FIG. 4. Further, this prior art process is difficult to adopt if there is a gap between the pocket 13 and the multi layer unit 14, and therefore, high precisions of the pocket 13 and the multi layer unit 14 are required. It is also clear that the prior art process is troublesome both for putting a multi layer unit 14 into a pocket 13 and for taking it from the pocket 13.

SUMMARY OF THE INVENTION

It is an object of the present invention to provide a method of forming external electrodes on an electronic component of chip type such as a monolithic ceramic capacitor, a monolithic resistor, an inductor and the like wherein external electrodes are formed like a square bracket symbol on two opposite sides of an electronic component with use of a thin film technique such as the vacuum deposition process, the sputtering process, the ion plating process or the like.

It is another object of the present invention to provide a method of forming external electrodes on an electronic component of chip type, which method is easy to execute practically.

A method of forming electrodes on an electronic component of chip type for connecting to the external with a thin film technique according to the invention, comprising the steps of:

putting an electronic component so as for the first principal plane thereof to face toward a scattering source of a material for forming an electrode, said first principal plane being covered with a mask except for both first edge portions which extend a little to the center of the first principal plane from both first edges defined by the first principal plane and each of two opposing end planes of the component;

depositing a thin film of said electrode material on each of the first edge portions and on both second edge portions which extends on said end planes each from the first edge;

then, putting said electronic component so as for the second principal plane counter to the first principal plane to face toward the scattering source, said second principal plane being covered with the mask except for both third edge portions which extend a little to the center of the second principal plane from both second edges defined by the second principal plane and each of the two end planes of the component;

depositing a thin film of said electrode material on each of the third edge portions and on both fourth edge portions which extend on said end planes each from the second edges so as to overlap partially with the thin film having been deposited on the second edge portion.

Following advantages can be obtained according to the present invention:

First, external electrodes can be formed as thin film so that no boss portions of external electrodes are formed.

Second, an electronic component of chip type can be absorbed by a vacuum chuck apparatus because no gaps are formed between the electronic component and the vacuum chuck apparatus. This enables an electronic component to be loaded automatically onto a printed circuit board. Further, the precision of the positioning of an electronic component can be increased because the external electrodes are thin.

Third, the thickness of the main body 21 of an electronic component of chip type can be increased by the decrease in the thickness of the boss portions. Then, as to a monolithic ceramic capacitor, the number of the layers of dielectric ceramic can be increased so that the capacitance increases. This also increases the deflective strength.

Fourth, external electrodes can be made of an electrode material which does not contain any alkaline metal. A prior art baked electrode made from silver paste has not sufficient moisture resistance because it contains at least one alkaline metal as a glass frit component. On the other hand, an electronic component of chip type according to the present invention is superior in the moisture strength.

Fifth, a base metal such as nickel, chromium, copper and aluminum can be used as electrode material so that the cost of an electronic component of chip type can be reduced.

Sixth, the adhesive strength of an external electrode becomes larger when compared with that of an conventional electronic component of chip type wherein the external electrodes are formed only on a plane. This improves the reliability of an electronic component of chip type.

Finally, an electronic component of chip type according to the present invention is easy to be mounted so that the working efficiency and the productivity can be increased.

BRIEF DESCRIPTION OF THE DRAWINGS

Other objects and advantages of the invention will be apparent from the following description, the accompanying claims and the accompanying drawings.

DESCRIPTION OF THE PREFERRED EMBODIMENT

Figure 1:
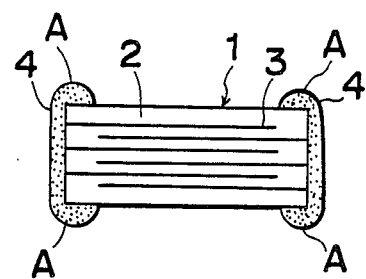
FIGS. 1-3 are an elevational views of a monolithic ceramic capacitor, a resistor and an inductor of chip type, respectively.
Figure 2:
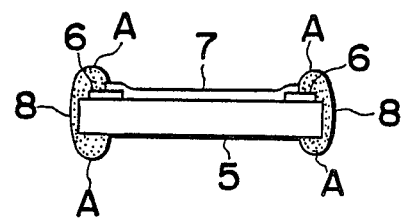
Figure 3:
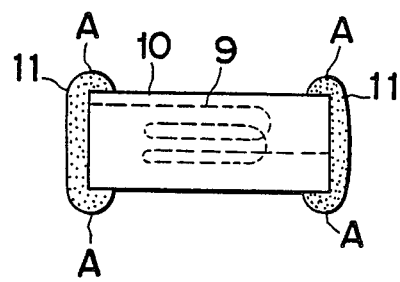
Figure 4:
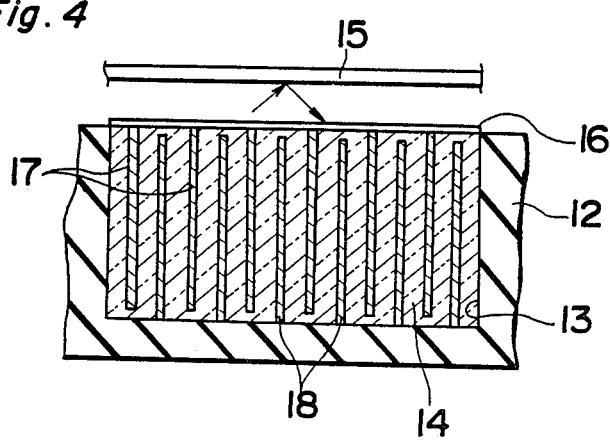
FIG. 4 is an elevational sectional view of a monolithic ceramic capacitor of chip type in the step of forming an electrode with a sputtering process.
Figure 5:
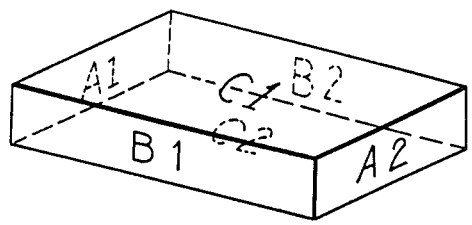
FIG. 5 is a perspective view of an electronic component of chip type in order to designate the surfaces.

The present embodiment is applied to an electronic component of chip type having a shape of hexahedron, especially of parallelepiped as shown in FIG. 5. The electronic component has left and right sides (hereinafter referred to as left and right end planes) A1, A2, front and back sides B1, B2, and top and bottom planes (hereinafter referred to as first and second principal planes) C1, C2, as designated in FIG. 5.

FIGS. 6(a)-(d) show steps of forming external electrodes, having a section in the shape of a square bracket symbol, on the left and right sides, namely end planes, A1, A2 extending to edge portions C1L, C1R, C2L, C2R defined below of the first and second planes C1, C2.

Figure 6:
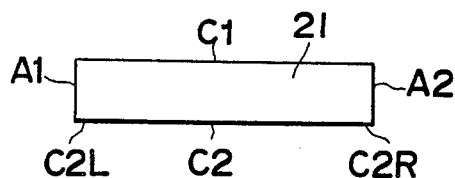
FIGS. 6(a)-(d) are elevational views which show the steps according to a preferred embodiment of the present invention successively.

First, an electronic component 21 of chip type of having the shape of a parallelepiped as shown in FIG. 6(a) is prepared.

Next, as shown in FIG. 6(b), a conducting part 22a is formed continuously from an edge portion of the left end plane A1 to a left edge portion C2L of the second principal plane C2, while another 23a is formed continuously from an edge portion of the right end plane A2 to a right edge portion C2R of the second principal plane C2. The edge portions of the left and right end planes A1, A2 extend thereon from the edges defined by the second principal plane C2 and the end planes A1, A2, while the edge portions C2L, C2R of the second principal plane C2 extend a little toward the center of the plane C2 from the edges.

Then, as shown in FIG. 6(c), the electronic component 21 is turned over so that the first and second principal planes C1, C2 take the reversed position.

Further, as shown in FIG. 6(d), a conducting part 22b is formed continuously from an edge portion of the left end plane A1 to a left edge portion C1L of the first principal plane C1, while a conducting part 23b is formed continuously from an edge portion of the right end plane A2 to a right edge portion C1R of the first principal plane C1. The edge portions of the left and right planes A1, A2 extend thereon from the edges defined by the first principal plane C1 and the end planes A1, A2, while the edge portions C1L, C1R of the first principal plane C1 extend a little toward the center of the plane C1 from the edges. In this process, the conducting parts 22b and 23b are prepared so as to lap the conducting parts 22a and 23a, respectively. (It should be noted that the terms "top" and "base" follows the definition in FIG. 5. Therefore, the real position of the "top" and "base" planes in FIGS. 6(c) and 6(d); are contrary to the designation.)

By using the above-mentioned steps, external electrodes can be formed in the shape of a square bracket symbol.

In the turn-over step shown in FIG. 6(c), the left and right end planes A1 and A2 may also be reversed to each other.

Figure 7:
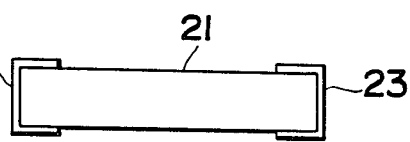
FIG. 7 is an elevational view of an electronic component of chip type according to the preferred embodiment of the present invention.
Figure 6:
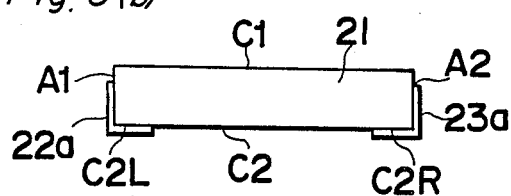
Figure 6:
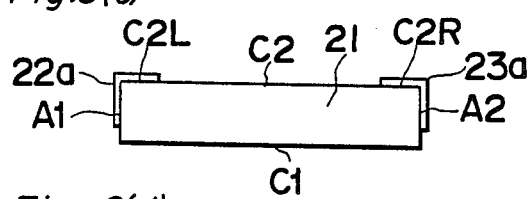

FIG. 7 shows an electronic component 21 of chip type where two external electrodes 22 and 23 are formed like a square bracket symbol at both end planes. The overlap of the two conducting parts 22a, 22b, and the two conducting parts 23a, 23b are emphasized schematically in FIG. 6(d), but the external electrodes are really observed like square bracket symbols as shown in FIG. 7 because the conducting parts 22a, 22b, 23a, 23b are thin films.

Figure 8:
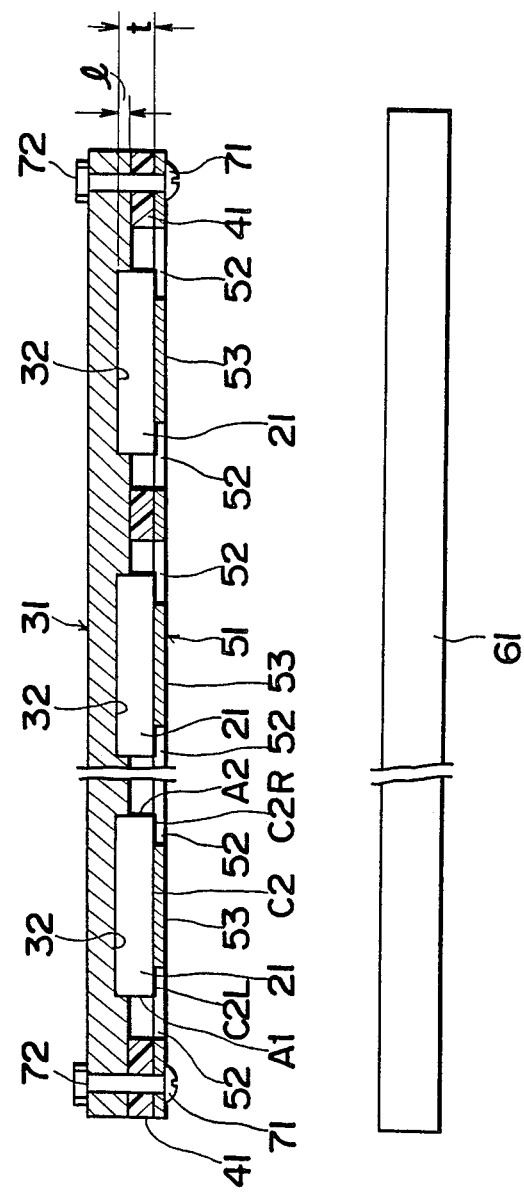
FIG. 8 is an elevational sectional view showing a plurality of electronic components of chip type set in a holder.

In the following, the embodiment of the invention will be explained in detail:

FIG. 8 shows an elevational sectional view of a plurality of electronic components 21 of chip type set in a jig. They are arranged in hollows of a holder 31. A hollow takes a form of a groove 32 in this embodiment, and a plurality of electronic components 21 are arranged in a groove 32, adhered closely to each other. (This situation is not clear in FIG. 8.) That is, a front side B1 of an electronic component 21 is adhered closely to a back side B2 of another, by using the designation of faces adopted in FIG. 5. The grooves 32 are made in parallel to each other. Thus, external electrodes can be formed on a plurality of electronic components 21 of chip type at the same time. The depth l of a groove 32 and the thickness t of an electronic component 21 of chip type which is set in a groove 32 should have a relation $l < \frac{1}{2}t$.

Figure 9:
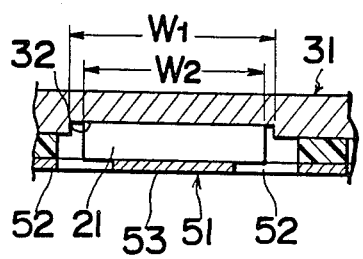
FIG. 9 is an enlarged sectional view of an electronic component set in a holder.
Figure 6:
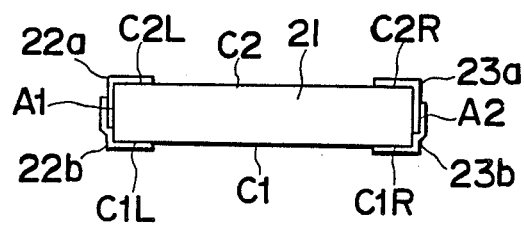

An electronic component 21 of chip type is set in a groove 32 with no gap as shown in FIG. 8. However, as shown in FIG. 9, the width W1 of a groove 32 can be made a little broader than W2 of an electronic component 21, that is, the distance between the left end plane A1 and the right end plane A2.

Spacers 41 are used in order to expose left and right end planes A1, A2 of electronic component 21 of chip type. In this embodiment, spacers 41 are independent components of a jig. However, spacers 41 may be formed as one body with a holder 31, or with a mask 51 which will be mentioned below.

A mask 51 is fit closely to the second principal planes C2 of electronic components of chip type. The mask 51 has slits 52 so that the left and right edge portions C2L, C2R of the second principal planes C2 are exposed when the mask 51 is viewed from below. The remainder of the mask 51 except the slits 52 is shades 53 which can cover central parts of the second principal planes C2. Then, the shades 53 prevent the deposition on the central parts of electrode material which will be scattered from the scattering source in the formation step of conducting part which will be described later.

The holder 31, the spacers 41 and the mask 51 are fastened to each other with bolts 71 and nuts 72. Thus, electronic components 21 of chip type are interposed and fastened between the holder 31 and the mask 51. Then, they are provided for the formation step of external electrodes.

A scattering source 61 of electrode material is arranged below parallel to the mask 51. The scattering source 61 is called a deposition source in the vacuum deposition process and the ion plating process, and it is made of deposition material placed on a heater, a boat or a crucible to be heated. In the sputtering process, the scattering source 61 is called as a target. The scattering source 61 shown in FIG. 8 is a target.

The step of forming external electrodes will be explained next with reference to FIGS. 1 and 6(a)–(d). A jig which sets electronic components 21 of chip type, as shown in FIG. 8, and a scattering source (target) 61 are arranged in a vacuum chamber so that the left and right edge portions C2L, C2R of the second principal plane C2 are exposed through the slits 52 of the mask 51 when viewed from the scattering source 61. When particles are scattered from the scattering source 61 by using the sputtering process, they adhere to the exposed left edge portions C2L and exposed portions of the left end plane A1 continuously and to the exposed right edge portions C2R and an exposed portions of the right end plane A2 continuously. Though the exposed portions of the left and right end planes A1, A2 are not opposed to the scattering source 61, particles can adhere on them from oblique directions. Particles do not adhere on the remaining part of electronic components 21 of chip type because the shades 53 of the mask 51 and the close adherence of the front and back sides B1, B2 of the electronic components 21 prevent the adhesion of particles on unnecessary portions. FIG. 6(b) shows an electronic components 21 of chip type on which conducting parts 22a, 23a are formed as mentioned above.

Next, the electronic components 21 are taken away from the jig, and reversed as shown in FIG. 6(c). Then, they are again arranged in the jig, as shown in FIG. 8, so that the left and right edge portions C1L, C1R of the first principal plane C1 are exposed through the slits 52 of the mask 51 when viewed from the scattering source 61.

Then, by using a similar step, a conducting part 22b is formed from the exposed left end portion C1L to an exposed part of the left end plane A1 continuously, while another 23b is formed from the exposed right edge portion C1R to an exposed part of the right end plane A2 continuously, as shown in FIG. 6(d). As mentioned above, the depth l of a groove 32 is made smaller than a half of the thickness of an electronic component 21 so that the conducting parts 22b and 23b overlap partly on the counterparts 22a and 23a, respectively. Thus, as shown in FIG. 7, external electrodes 22, 23 are formed continuously like a square bracket symbol on the left and right end planes A1, A2, respectively.

Electrodes 22 (22a, 22b) and 23 (23a, 23b) prepared by using the above-mentioned steps have a sufficient thickness so that they will not be eaten away by solder on soldering.

Further, the conducting parts 22a, 22b, 23a, 23b are formed like a character L so that their adhesive strength becomes large.

Figure 10:
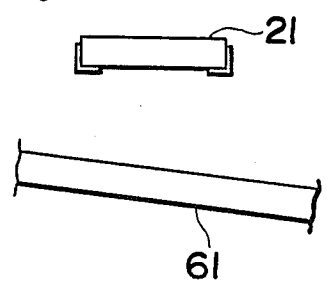
FIG. 10 is a schematic diagram of the position of an electronic component and a scattering source.

In the embodiment described above, the jig is arranged parallel to the scattering source 61. However, the scattering source 61 may be arranged obliquely to the jig (for example, inclined leftward or rightward as shown in FIG. 10) in order to accelerate the deposition on the end planes A1, A2. On the contrary, the jig 61 may be inclined to the scattering source.

Further, the jig and the scattering source 61 may be moved to become inclined to each other during the above-mentioned processes.

Not only a base metal such as nickel, chromium, copper and aluminum but also a conductive compound material such as nickel oxide, tin oxide, manganese oxide, iron oxide, cobalt oxide, nickel nitride and nickel oxide (the first layer) and nickel nitride (the second layer) can be applied to external electrodes 22, 23. When they are made from a compound material mentioned above, the insulating resistance at high temperatures does not deteriorate.

This embodiment according to the invention can be applied not only to a monolithic ceramic capacitor of chip type but also to a resistor and an inductor of chip type, as far as they have a shape of a parallelepiped.

The preferred embodiments described herein are illustrative and not restrictive, the scope of the invention being indicated by the appended claims and all variations which come within the meaning of the claims are intended to be embraced therein.

What is claimed is:

1. A method of forming electrodes on an electronic component of chip type for connecting to the external with a thin film technique, comprising the steps of:
    locating an electronic component so that a first principal plane thereof faces toward a scattering source of an electrode-forming material for forming an electrode, said first principal plane being covered with a mask except for a pair of edge portions of said first principal plane which extend a little toward the center of the first principal plane from a pair of first edges, which are respectively defined by the first principal plane and two opposing end planes of the component;
    depositing a thin film of said electrode material on each of the edge portions of said first principal plane, on said first edges, and on first portions of said end planes, which extend on said end planes from the first edges;
    then, locating said electronic component so that a second principal plane counter to the first principal plane faces toward the scattering source, said second principal plane being covered with the mask except for a pair of edge portions of said second principal plane which extend a little toward the center of the second principal plane from a pair of second edges, which are respectively defined by the second principal plane and the above-mentioned two end planes of the component; and
    depositing a thin film of said electrode material on each of the edge portions of said second principal plane, on said second edges, and on second portions of said end planes, which extend on said end planes from the second edges so as to overlap partially with the thin film having been deposited on said first portions of said end planes.

2. A method of forming electrodes according to claim 1, wherein said electronic component is a capacitor.

3. A method of forming electrodes according to claim 1, wherein said electronic component is a resistor.

4. A method of forming electrodes according to claim 1, wherein said electronic component is an inductor.

5. A method of forming electrodes according to claim 1, wherein said thin film technique is the sputtering process.

6. A method of forming electrodes according to claim 1, wherein said thin film technique is the vacuum deposition process.

7. A method of forming electrodes according to claim 1, wherein said thin film technique is the ion plating process.

8. A method of forming electrodes according to claim 1, wherein said electronic component is a parallelepiped.

9. A method of forming electrodes according to claim 1, wherein in said locating step an electronic component of chip type is interposed between a holder and said mask.

10. A method of forming electrodes according to claim 9, wherein said holder has a hollow whose depth is smaller than a half of the thickness of an electronic component on which said electrodes should be formed.

11. A method of forming electrodes according to claim 10, wherein said hollow is a groove and a plurality of electronic components of chip type are put in the groove so that the sides of the electronic components, on which sides said electrodes should not be formed, are adhered closely to each other.

12. A method of forming electrodes according to claim 9, wherein a spacer is interposed between said holder and said mask.

13. A method of forming electrodes according to claim 1, wherein said electrode material of said scattering source is selected among base metals such as nickel, chromium, copper and aluminum.

14. A method of forming electrodes according to claim 1, wherein said electrode material of said scattering source is selected among compounds such as nickel oxide, manganese oxide, iron oxide, cobalt oxide and nickel nitride.

15. A method of forming electrodes according to claim 1, wherein said electronic component faces parallel to said scattering source in said locating step.

16. A method of forming electrodes according to claim 1, wherein said electronic component faces inclined to said scattering source in said locating step.

17. A method of forming electrodes according to claim 1, wherein said electrode-forming material of said scattering source is selected from the group consisting of nickel, chromium, copper and aluminum.

18. A method of forming electrodes according to claim 1, wherein said electrode-forming material of said scattering source is selected from the group consisting of nickel oxide, manganese oxide, iron oxide, cobalt oxide and nickel nitride.

19. A method of forming electrodes according to claim 1, wherein said thin film is simultaneously deposited on each of the edge portions of said first principal plane, on said first edges, and on said first portions of said end planes, in a single thin-film deposition step.

* * * * *